United States Patent
Fried et al.

(10) Patent No.: US 6,642,090 B1
(45) Date of Patent: Nov. 4, 2003

(54) FIN FET DEVICES FROM BULK SEMICONDUCTOR AND METHOD FOR FORMING

(75) Inventors: David M. Fried, Ithaca, NY (US); Edward J. Nowak, Essex Junction, VT (US); Beth A Rainey, Burlington, VT (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,994

(22) Filed: Jun. 3, 2002

(51) Int. Cl.[7] .......................................... H01L 21/8238
(52) U.S. Cl. ...................... 438/164; 438/218; 438/294; 438/514; 438/410
(58) Field of Search ................................ 438/154, 164, 438/199, 218, 294, 514, FOR 424, FOR 494, 410

(56) References Cited

U.S. PATENT DOCUMENTS

| | | | | |
|---|---|---|---|---|
| 4,361,600 A | * | 11/1982 | Brown | 438/410 |
| 4,437,226 A | * | 3/1984 | Soclof | 438/337 |
| 4,502,913 A | * | 3/1985 | Lechaton et al. | 438/295 |
| 4,561,932 A | * | 12/1985 | Gris et al. | 438/410 |
| 4,580,331 A | * | 4/1986 | Soclof | 438/337 |
| 4,648,173 A | * | 3/1987 | Malaviya | 438/151 |
| 4,764,799 A | * | 8/1988 | Malaviya | 257/514 |
| 4,845,048 A | * | 7/1989 | Tamaki et al. | 438/410 |
| 4,996,574 A | * | 2/1991 | Shirasaki | |
| 5,595,926 A | * | 1/1997 | Tseng | |
| 5,675,164 A | * | 10/1997 | Brunner et al. | |
| 5,963,789 A | * | 10/1999 | Tsuchiaki | 438/62 |
| 5,963,807 A | * | 10/1999 | Ueno | |
| 6,110,793 A | * | 8/2000 | Lee et al. | 438/400 |
| 6,174,784 B1 | * | 1/2001 | Forbes | 438/405 |
| 6,252,284 B1 | * | 6/2001 | Muller et al. | |
| 6,365,452 B1 | * | 4/2002 | Perng et al. | |
| 6,373,123 B1 | * | 4/2002 | Clampitt | 257/623 |
| 6,413,802 B1 | * | 7/2002 | Hu et al. | |
| 6,458,662 B1 | * | 10/2002 | Yu | |
| 6,461,889 B1 | * | 10/2002 | Samoto | |
| 2002/0036290 A1 | * | 3/2002 | Inaba et al. | |

* cited by examiner

*Primary Examiner*—George Fourson
*Assistant Examiner*—Joannie Adelle Garcia
(74) *Attorney, Agent, or Firm*—Schmeiser, Olsen & Watts; Mark F. Chadurjian

(57) ABSTRACT

The present invention thus provides a device structure and method for forming fin Field Effect Transistors (FETs) that overcomes many of the disadvantages of the prior art. Specifically, the device structure and method provides the ability to form finFET devices from bulk semiconductor wafers while providing improved wafer to wafer device uniformity. Specifically, the method facilitates the formation of finFET devices from bulk semiconductor wafers with improved fin height control. Additionally, the method provides the ability to form finFETs from bulk semiconductor while providing isolation between fins and between the source and drain region of individual finFETs. Finally, the method can also provide for the optimization of fin width. The device structure and methods of the present invention thus provide the advantages of uniform finFET fabrication while using cost effect bulk wafers.

18 Claims, 7 Drawing Sheets

FIN FET DEVICES FROM BULK SEMICONDUCTOR AND METHOD FOR FORMING

BACKGROUND OF THE INVENTION

Technical Field

The present invention relates generally to the field of semiconductor manufacturing and, more specifically, to a method for manufacturing fin field effect transistors.

The need to remain cost and performance competitive in the production of semiconductor devices has driven the increase in device density in integrated circuits. To facilitate the increase in device density, new technologies are constantly needed to allow the feature size of these semiconductor devices to be reduced.

The push for ever increasing device densities is particularly strong in CMOS technologies such as the in the design and fabrication of field effect transistors (FETs). FETs comprise the dominant components of CMOS. Scaling FETs to attain higher device density in CMOS results in degradation of performance and/or reliability.

One type of FET that has been proposed to facilitate increased device density is a fin Field Effect Transistor. In finFETs, the body of the transistor is formed from a vertical structure, generally referred to as a "fin" for its resemblance to the dorsal fin on a fish. The gate of the finFET is then formed on one or more sides of the fin. FinFETs have several advantages, including better current control without requiring increased device size. FinFETs thus facilitate scaling of CMOS dimensions while maintaining an acceptable performance.

Unfortunately, several difficulties arise in the design and fabrication of fin transistors. First, in fin transistors there is a general need to electrically isolate each finFET device. Specifically, finFET devices need to be isolated from each other, and the source and drain of individual devices need to be isolated to ensure source to drain decoupling. For this reason, finFETs have been typically manufactured from silicon-on-insulator (SOI) wafers to provide isolation between the fins of different devices. Specifically, the fins of the transistors are formed from the silicon layer above the buried isolation layer, and each fin is thus isolated from other fins by virtue of the buried isolation layer beneath the fins. Likewise the source and drains of individual finFETs are decoupled from each other by the buried isolation layer.

While the use of SOI wafers provides needed isolation for finFETs, it is not without significant drawbacks. The most compelling drawback of forming finFETs from SOI wafers is the added costs for SOI wafers compared to bulk silicon wafers. For example, SOI wafers can commonly cost two to three times the cost of bulk silicon wafers. This increased cost of SOI wafers, while acceptable for some applications, is prohibitive in others. Additionally, the use of SOI wafers is not compatible with all fabrication processes, such as commonly used SiGe processes.

The method of isolating devices on bulk wafers is described by Hisamoto et al, "A fully Depleted Lean— channel Transistor (DELTA) â€" A novel vertical ultra thin SOI MOSFET â€"" International Electron Devices Meeting 1989, Paper 34.5.1, pp 833–6. This method requires that a nitride spacer be built on the fin so that the fin is protected during the oxidation of the underlying substrate to form the region of isolation. Thus, the substrate is selectively oxidized with respect to the fin. The limitations of this process are the high temperature of the oxidation, 1100° C., and the inability to tailor the fin thickness while generating the isolation layer. As devices continue to scale their ability to withstand high temperature conditions decreases; as such, the process proposed in Hisamoto et al is incompatible with the nanoscale technologies in which FinFETs will find their use. Moreover, the inability to tailor fin thickness means that a critical dimension of these devices is solely determined by lithography. As will be discussed in more detail below, a feature of the method of the invention is that it provides the ability to tailor the fin via oxidation, enabling the optimization of fin thickness beyond lithographic capabilities.

Additionally, Hisamoto's process does not provide a method to control fin height. Bulk wafers lack a layer upon which the etch of the fin can terminate, such as is provided by the buried oxide layer in SOI wafers. Without this etch stop layer, variability in the etch depth translates to variability in the fin height. Since the amount of current conducted by the device is proportional to the height of the fin, it is important to minimize variability in the fin height.

Thus, there is a need for improved fabrication methods and structures to facilitate the formation of finFET devices from bulk silicon while minimizing device variations and providing sufficient device isolation.

BRIEF SUMMARY OF THE INVENTION

The present invention thus provides a device structure and method for forming fin Field Effect Transistors (FETs) that overcomes many of the disadvantages of the prior art. Specifically, the device structure and method provides the ability to form finFET devices from bulk semiconductor wafers while providing improved device uniformity.

In a first aspect, the invention is a method for forming a finFET in semiconductor substrate, the method comprising the steps of forming a fin from the semiconductor substrate; and exposing the substrate to a process that further defines the width of the fin while simultaneously isolating the fin.

In a second aspect, the invention is a method for forming a finFET in semiconductor substrate, the method comprising the steps of forming a fin from the semiconductor substrate, the fin including a fin sidewall, the formation of the fin exposing areas of the semiconductor substrate adjacent the fin; damaging at least a portion of the semiconductor substrate areas adjacent the fin; and oxidizing the semiconductor substrate such that oxide is formed in the damaged portion of the semiconductor substrate to a greater thickness than is formed on the fin sidewall.

The foregoing and other advantages and features of the invention will be apparent from the following more particular description of a preferred embodiment of the invention as illustrated in the accompanying drawings.

BRIEF DESCRIPTION OF THE SEVERAL VIEWS OF THE DRAWINGS

The preferred exemplary embodiment of the present invention will hereinafter be described in conjunction with the appended drawings, where like designations denote like elements.

DETAILED DESCRIPTION OF THE INVENTION

Figure 1:
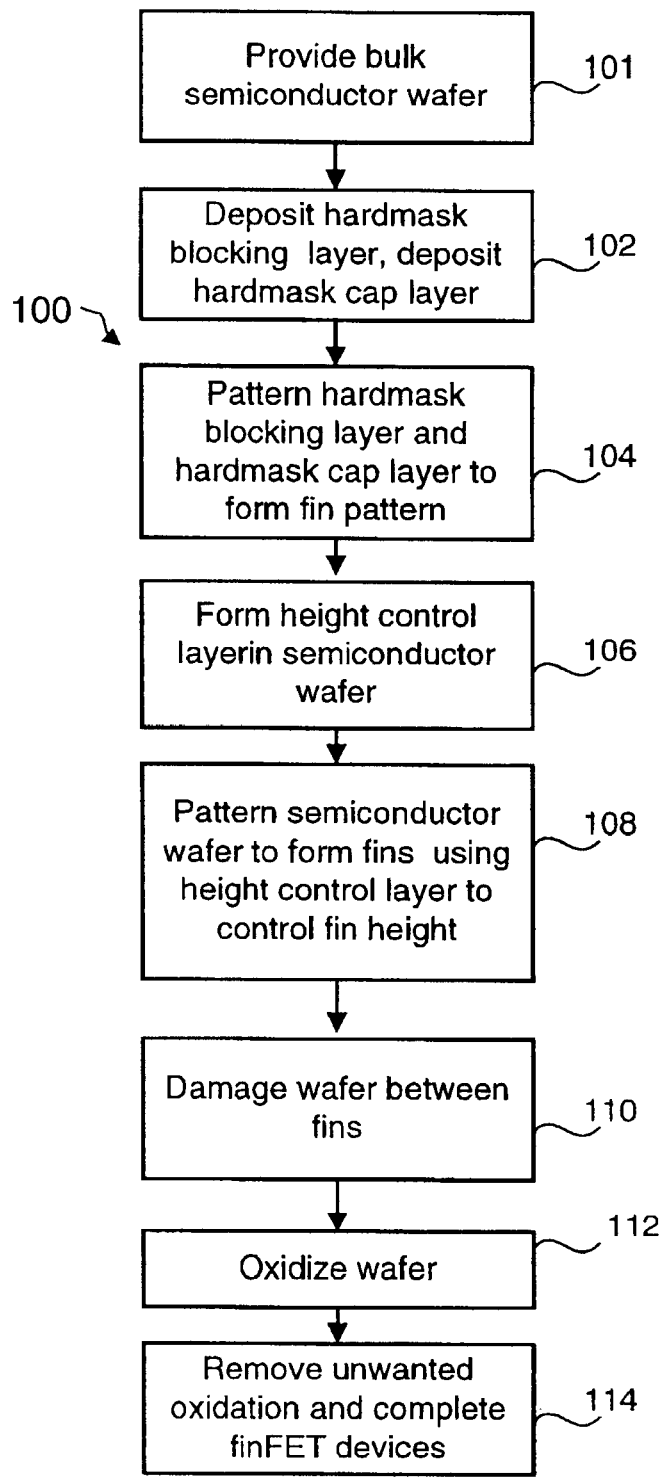
FIG. 1 is a flow diagram illustrating a fabrication method of the invention.

The present invention thus provides a device structure and method for forming fin Field Effect Transistors (FETs) that overcomes many of the disadvantages of the prior art. Specifically, the device structure and method provide the ability to form finFET devices from bulk semiconductor wafers while improving device uniformity. The method facilitates the formation of finFET devices from bulk semiconductor wafers with improved fin height control. Additionally, the method provides the ability to form finFETs from bulk semiconductor while providing isolation between fins and between the source and drain region of individual finFETs. Finally, the method can also provide for the optimization of fin width. The device structure and methods of the present invention thus provide the advantages of uniform finFET fabrication on bulk wafers.

One embodiment of the invention uses a process before fin patterning for improved fin height control. This process can comprise the implantation of a heavy ion that damages the substrate to a desired depth and thus changes the etch rate of the damaged substrate relative to that of the undamaged substrate. This allows for improved height control during fin patterning by minimizing the effects of etch rate variations. A second alternative process can comprise the implantation or formation of a marker layer at a desired depth. During fin etching, the elements of the marker layer are monitored to precisely determine when the desired etch depth is reached. Both process control techniques thus provide for improved fin height uniformity, allowing fins to be formed from bulk semiconductor wafers with minimum wafer to wafer variation.

A second aspect of the invention generates isolation between adjacent fins and between the source and drain regions of individual finFETs. Additionally, this process optimizes the width of the fins themselves. The process first selectively damages the semiconductor wafer between fins. This selective damage can be attained by implanting suitable heavy ions between fins or by implantation of a p-type species followed by a selective anodic reaction. These methods damage the exposed semiconductor wafer adjacent to the fins, but damage to the fins themselves is minimized by a protective hardmask layer on the top of the fins. The wafer is then oxidized. This results in oxidation being formed on the sidewalls of the fins and in the areas between the fins. The damaged area of the wafer oxidizes faster than undamaged areas, thus resulting in a greater oxide thickness between the fins than on the fin themselves. This oxidation rate differential allows sufficient oxide between the fins without overly narrowing the fins.

This process results in sufficient oxidation between fins to provide isolation between fins and between the source and drain region of the fins. Additionally, the formation of the oxide on the fins narrows the fins themselves. When the oxide is removed from the sidewalls of the fins, the resulting fin width is further optimized from the original width, while sufficient oxide remains between the fins to provide isolation. This process thus isolates the fins and optimizes the width of the fins at the same time.

Thus, the provided methods facilitate the formation of finFET devices from bulk silicon while providing increased control of fin height and width and increased isolation of the source and drain regions of the fin.

The present invention may be readily adapted to a variety of finFETs and their related devices, which heretofore have mostly been fabricated on SOI substrates. For example, the methods can be used in the formation of double gate finFETs as disclosed in U.S. Pat. No. 6,252,284. It will be thus understood by one of ordinary skill in the art that the invention is not limited to the specific structures illustrated in the drawings or to the specific steps detailed herein. It will also be understood that the invention is not limited to use of any specific dopant types provided that the dopant types selected for the various components are consistent with the intended electrical operation of the device.

Turning now to FIG. 1, exemplary method 100 for forming finFETs in accordance with the present invention is illustrated. The fabrication method 100 allows finFETs to formed with improved wafer to wafer uniformity and sufficient device isolation from bulk semiconductor wafers. Thus, method 100 provides the advantages of producing finFETs in a more cost-effective fabrication process. Method 100 will now be described in detail, along with examples of one embodiment of a wafer portion during process in FIGS. 2–7.

The first step 101 of FIG. 1, is to provide a suitable bulk semiconductor wafer. The next step 102 of method 100 is to deposit a suitable hardmask blocking layer and then deposit a suitable hardmask cap layer. Both the hardmask blocking layer and the hardmask cap layer can comprise any suitable material and any suitable thickness. For example, the hardmask blocking layer can comprise 40–100 nm of silicon dioxide, and the hardmask cap layer can comprise 5–50 nm of silicon nitride. As will become clear, the hardmask cap layer and the hardmask blocking layer will be used to pattern the underlying semiconductor substrate and to protect the fins during the formation of isolation.

Figure 2:
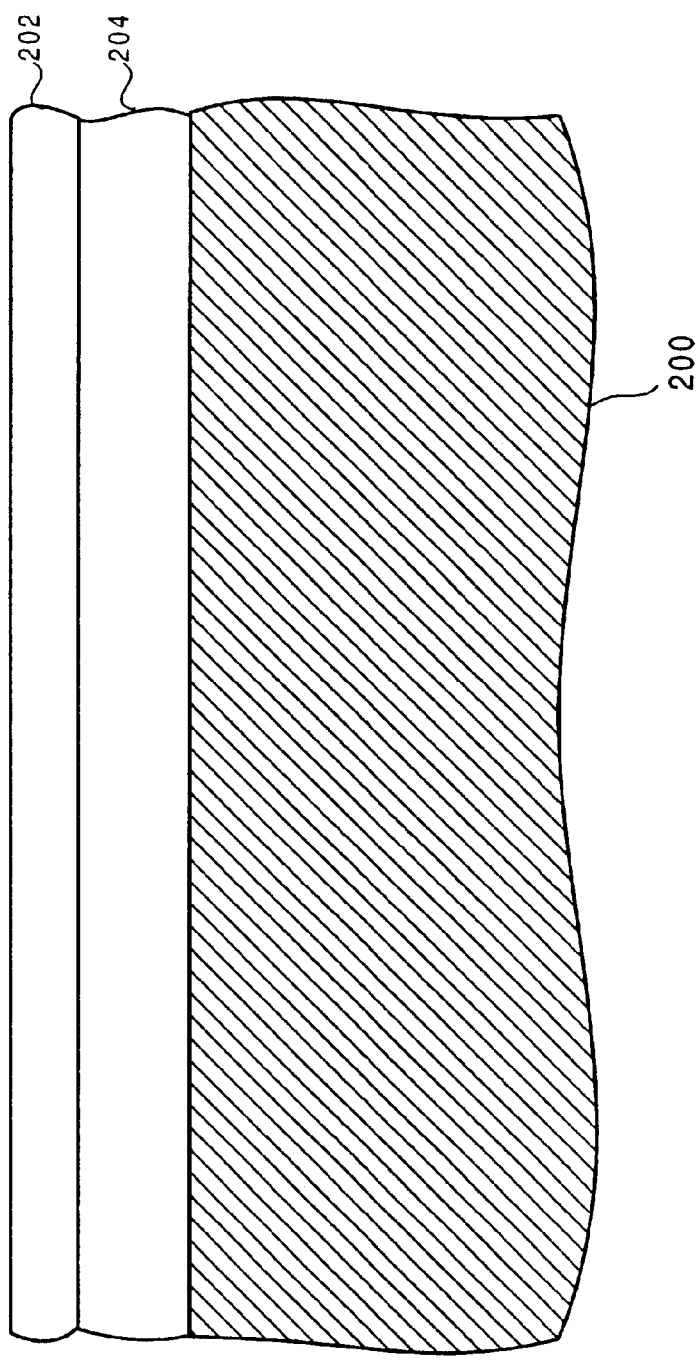
FIGS. 2–7 are cross-sectional side views of an embodiment of a semiconductor structure of the invention during the fabrication method of FIG. 1.

Turning now to FIG. 2, an exemplary wafer portion 200 is illustrated that includes a hardmask blocking layer 204 and a hardmask cap layer 202. Again, the wafer portion 200 can comprise any suitable bulk semiconductor wafer, such as a silicon <100> wafer. Likewise, the hardmask blocking layer 204 and hardmask cap layer 202 can comprise any suitable hardmask material, such as silicon dioxide and silicon nitride, respectively.

Returning to FIG. 1, the next step 104 is to pattern the hardmask blocking layer and the hardmask cap layer to form the fin pattern. This can be done using any suitable process, and would typically involve the deposition and patterning of a suitable photoresist. The hardmask blocking layer and hardmask cap layer can then be patterned selective to the developed photoresist with a reactive ion etch (RIE). The patterned hardmask layers will then be used to pattern the underlying semiconductor substrate during a silicon RIE to define the fins that will be used to form the finFET devices. As such, the length and width of the patterning would be determined by the desired fin size for the particular application.

Figure 3:
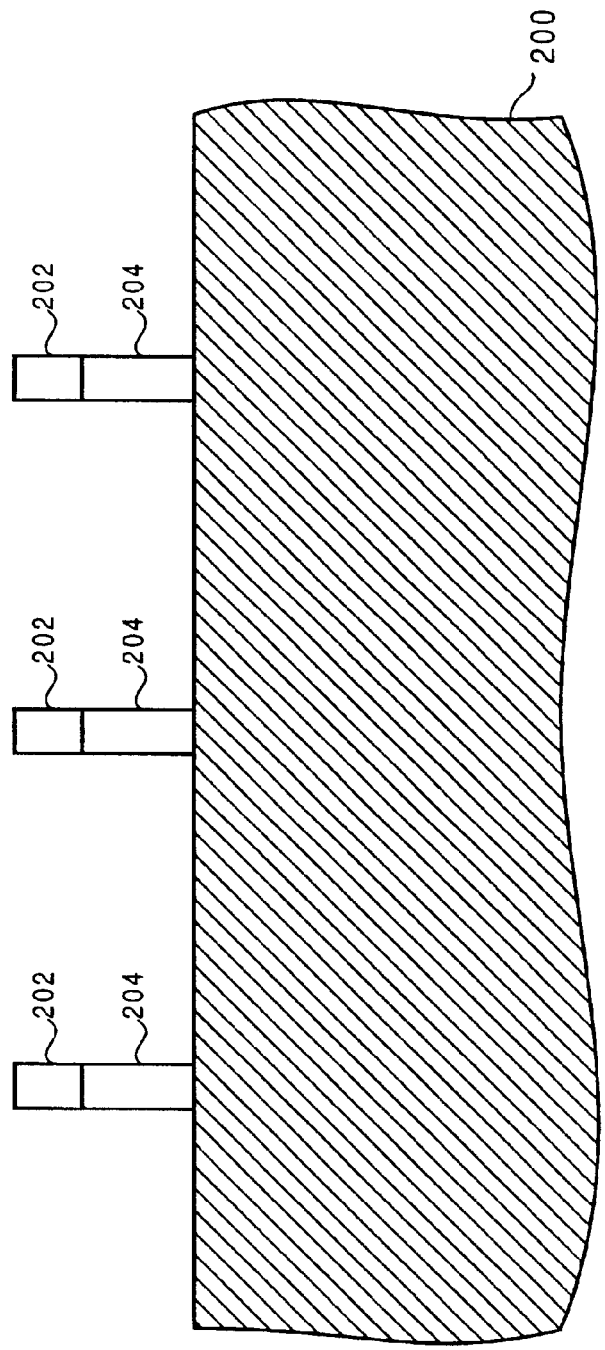

Turning now to FIG. 3, the wafer portion 200 is illustrated after the hardmask blocking layer 204 and the hardmask cap layer 202 have been patterned.

Returning to FIG. 1, the next step 106 is to form a height control layer in the semiconductor wafer. Then, the next step 108 is to pattern the semiconductor wafer to form the fins using the height control layer to control fin height. There are several different types of height control layers that can be used. For example, the layer can comprise the implantation of a heavy ion that damages the substrate to a desired depth and thus changes the etch rate of the damaged substrate relative to that of the undamaged substrate. This allows for improved height control during fin patterning by minimizing the effects of etch rate variations. In the alternative, the height control layer can comprise the formation of a marker layer at a desired depth. During fin patterning, the elements of the marker layer are monitored for to provide precise detection of when desired fin height is reached. Both techniques thus provide for improved fin height control, allowing fins to be reliably formed from bulk semiconductor wafers.

When the height control layer comprises an ion implant that damages the substrate, any suitable ion can be used that sufficiently damages the exposed portion of the semiconductor substrate to change the etch rate of the damaged substrate relative to that of the undamaged substrate. For example, a As ion implant can be used to damage the semiconductor wafer. Other suitable ions would include germanium, cesium, antimony or other heavy ion. The energy of the implant is then selected to drive the damage to the desired depth of the fin. For example, to create a fin height of approximately 800 angstroms, we would use an As implant of 140 keV and a dose of $1 \times 10e^{16}/cm^2$. Using a suitable etch, the damaged portion can be etched faster than the undamaged portion, and a timed etch is more likely to result in a consistent depth of etch. Stated another way, the undamaged portion etches slower than the damaged portion and in a timed etch the overetch in the undamaged area is minimized. Thus, the ion implant improves the height control of the resulting fins.

When the height control layer comprises a marker layer, detection of the marker ion indicates when the desired depth has been reached during the etch process. The marker layer can comprise any suitable species, such as oxygen, hydrogen or germanium. The marker layer can be formed by implanting the marker species (such as Ge) into the substrate. Alternatively, the marker layer can be formed by depositing the species on the substrate, and forming an additional semiconductor substrate layer over the deposited marker layer. The fins would then be etched from the layer on top of the marker layer. The marker species is monitored for while the semiconductor substrate layer is etched to define the fin. When the marker species is detected the etch is stopped as the presence of the species indicates that the desired depth has been reached. The presence of the marker layer species helps determine when the etch process should be stopped, and thus results in a consistent depth of etch. For example, the marker layer could be a SiGe layer between 800–1000 angstroms thick with a Ge concentration between 25%–50%.

Both techniques thus provide for improved fin height control, allowing fins of consistent height to be reliably formed from bulk semiconductor wafers. In all of these embodiments the etch chemistries would be selected to be compatible with the type of height control layer and to be selective to the hardmask cap layer that is used to define the fin pattern.

Figure 4:
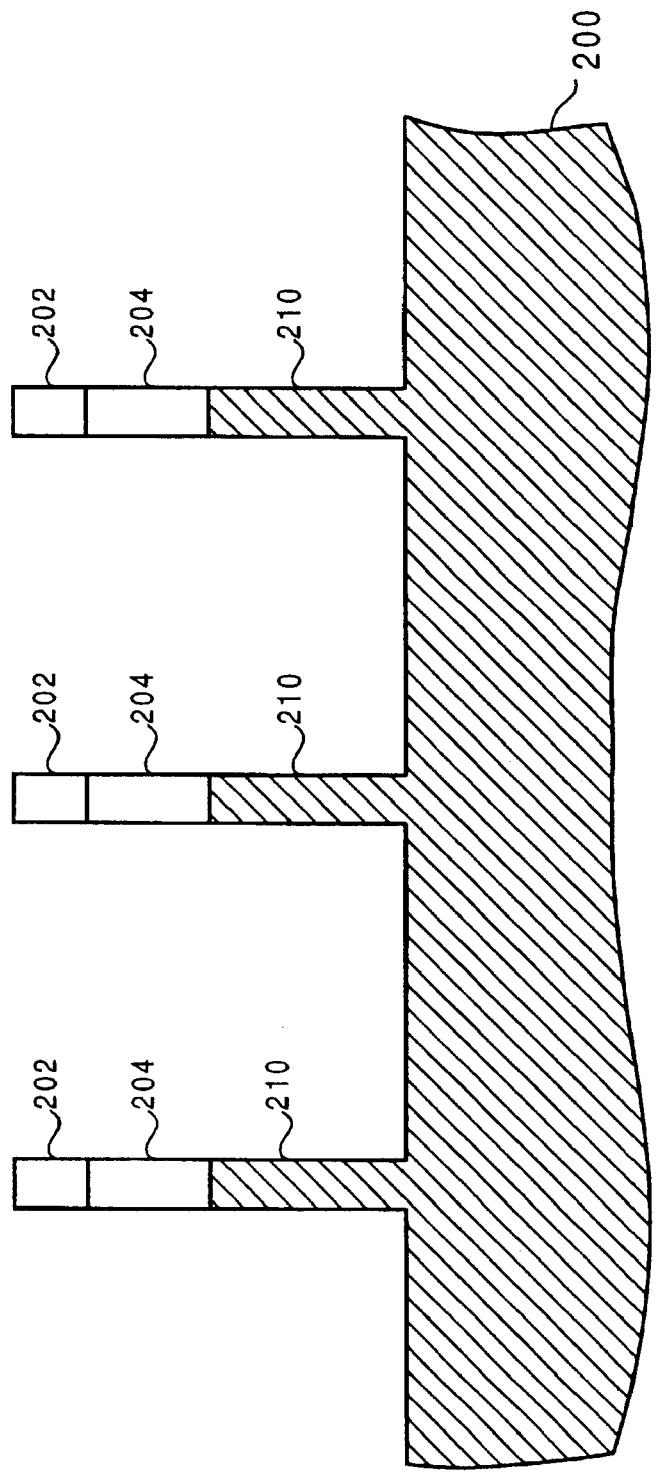

Turning now to FIG. 4, the wafer portion 200 is illustrated after the formation of a height control layer, and after the semiconductor substrate has been patterned to form fins 210. Again, because a height control layer was used the height of fins will have improved uniformity from wafer to wafer.

In some cases it will be desirable to remove the cap layer at this point. This could be done using any suitable technique, such as a wet or dry etch that is selective to underlying hardmask and exposed silicon. The underlying hardmask blocking layer is thus left, and will be used to protect the fins in future process. In other cases, the cap layer can be left in place to further protect the fin during future processing.

The next step 110 is to damage the substrate between the fins. As will become clear, the damage to the substrate is meant to increase the oxidation rate of the substrate between the fins relative to the oxidation rate of the fins themselves.

One method of damaging the substrate is to implant a suitable element into the substrate between the fins. This implant is suitably done perpendicular to the surface of the substrate and thus the blocking hardmask layer prevents the implant from directly damaging the fins, although some straggle may occur. Any suitable implant can be used to damage the substrate, although it is generally preferable to chose a heavy ion that will best damage the substrate and thus increase the oxidation rate of the substrate. For this reason, implanting As (at a dose between approximately $1 \times 10e^{16}/cm^2$ and $1 \times 10e^{17}/cm^2$ and at an energy of approximately 40–60 keV) is a suitable choice. Other suitable implant species include cesium, oxygen and germanium.

An alternative method of selectively damaging the semiconductor substrate is via an anodic reaction selective to a p-type implant. In this process, a p-type ion is implanted into the semiconductor substrate between the fins. The p-type implant can comprise any suitable species, such as boron. Again, the blocking hardmask layer prevents the p-type implant from directly damaging the fins. After the p-type implant, the substrate is annealed. The implanted regions are then exposed to a chemical etchant such as HF/alcohol and an anodic reaction occurs. This damages the implanted regions. Specifically, the anodic reaction makes the implanted regions become porous. The amount of damage can be controlled by the density and energy of the p-type implant, the HF concentration and the HF/alcohol mixture, as well as reaction current density and time. The damaged area again has an increased oxidation rate, and thus will result in differential oxide thickness between the substrate and the fins.

Figure 5:
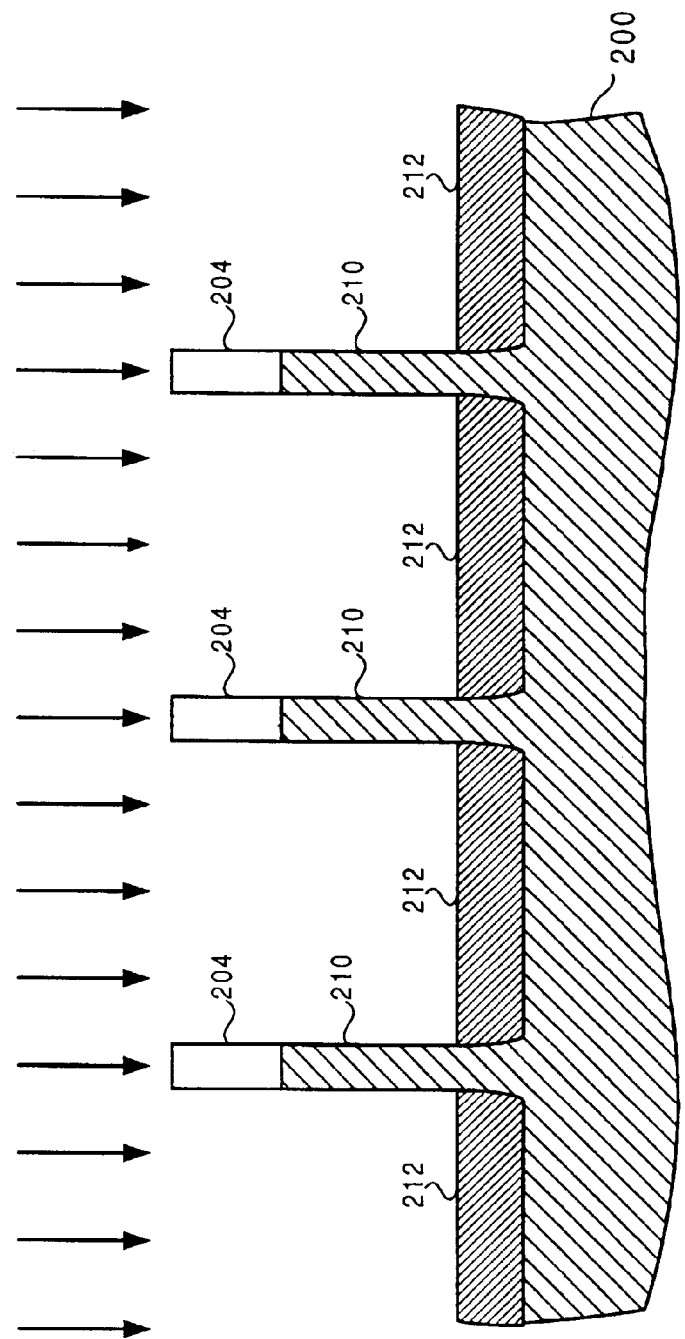

Turning now to FIG. 5, the wafer portion 200 is illustrated after the hardmask cap layer 202 has been removed and a damaging process performed to create damaged portions 212 of the substrate. Because the fins are protected by the remaining hardmask blocking layer 204, and because the implant is primarily vertical, the damaged portions 212 of the semiconductor substrate will be concentrated in the areas between the fins.

Returning to FIG. 1, the next step 112 is to oxidize the damaged areas of the wafer. This can be done using any suitable oxidation process. As stated above, the damaged areas of the wafer oxidize at a much greater rate than the undamaged areas. Thus, oxide will form more rapidly and more deeply in areas between the fins than on the fins themselves. At the preferred oxidation conditions of 800Å° C. for 40 minutes, the ratio of the two oxidation rates is approximately 5:1. This generates an oxide of sufficient thickness between the fins to isolate the fins from each other without completely oxidizing the fin away. Additionally, the growth of oxidation under the fins further isolates the fins. Specifically, the growth of oxidation under the fins will result in improved isolation between the source and drains of the transistors themselves. Without this isolation current can potentially flow under the fins between the source and the drain as this area may not be completely controlled by the gates of the transistor. It should be noted that the oxide grown under the fin does not necessarily need to completely extend under the fin to provide sufficient isolation between the source and drain of the transistor, although in some cases it would be desirable.

Another aspect of this step is that the growth of oxide on the sidewalls of the fins serves to narrow the width of the remaining semiconductor material in the fins. Narrowing of the fin can improve the performance of the transistor by improving the current control provided by the gate. It should be noted that in many cases it is desirable for the fin to be narrower than can be accurately patterned using traditional lithography. For this reason, it will be desirable in many cases to use image enhancement techniques such as sidewall image transfer to define the width of the fin. The embodiments of the invention thus provide additional advantage by further narrowing the width of the fin during formation of the isolation between the fins without completely oxidizing the fin away.

Figure 6:
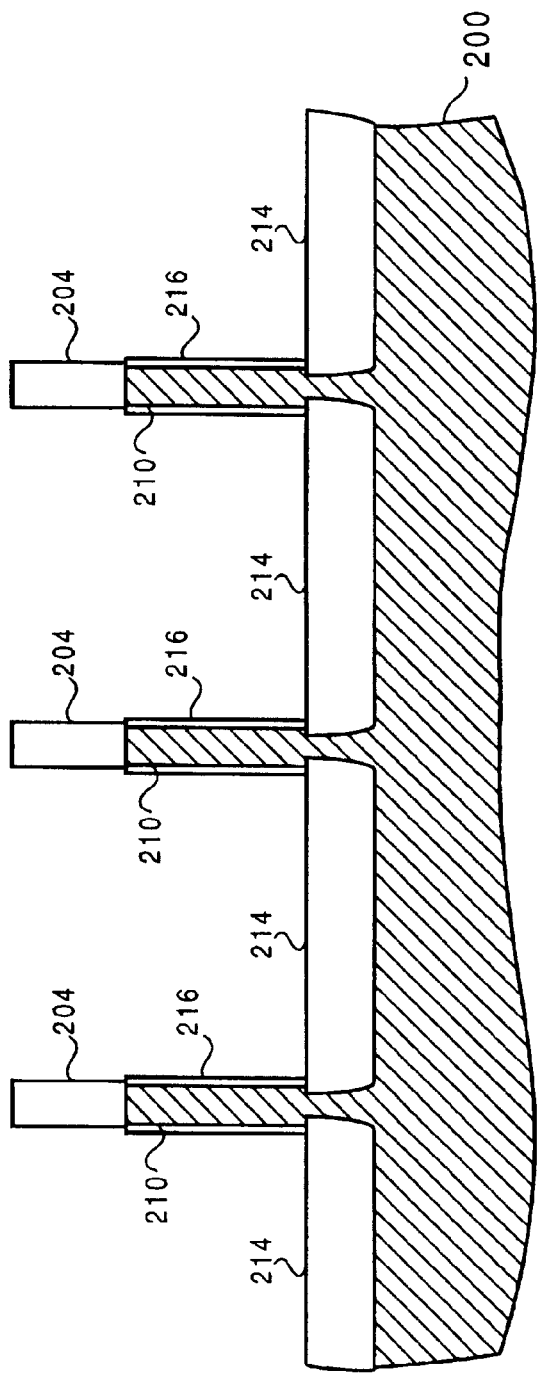

Turning now to FIG. 6, the wafer portion 200 is illustrated after the oxidation has formed isolation 214 between the fins 210. Additionally, the oxidation has formed oxide 216 on the sidewalls of the fins 210. Because the substrate areas between the fins were damaged before oxidation, the rate of oxide growth between the fins is much greater than in other areas, such as on the sidewalls of the fins. Additionally, the formation of oxide 216 on the fins 210 serves to further narrow the width of the fins.

Returning to FIG. 1, the next step 114 is to remove unwanted oxide and complete the finFET devices. Because the oxide formed on the sidewalls of the fin is much thinner than the oxide formed between the fins, it can be removed from the sidewalls while leaving sufficient isolation oxide between the fins. Furthermore, the formation of oxide on the sidewall of the fins further narrows the width of the fins themselves.

With the fins defined and the isolation formed, the finFETs can then be completed. As stated before, the described methods can be applied to any type of finFET manufacturing process. A short description of an exemplary process will now be given, but those skilled in the art will recognize that other suitable processes could be used.

The first step in the exemplary process would be to dope the fins Typically, this may include an ion implantation into the fins so as to form P-well structures and Nâ∈" well structures. In the CMOS technology of the present invention, P-well structures and Nâ∈" well structures are formed to allow the integration of NFETs and PFETs in a common substrate. P, As and Sb, for example, are well suited for PFET wells. B, In and Ga, for example, are well suited for NFET wells. Ion implantation is typically designed to achieve a concentration of between $1 \times 10^{17}$ cm$^{-3}$ to $5 \times 10^{18}$ cm$^{-3}$ for example. In one embodiment, ion implantation may comprise an angled implant into exposed opposing vertical sidewalls of semiconductor layer, and would serve to properly dope the fins.

The next steps would be to form gate stacks. This can comprise forming gate insulator layers on opposing vertical sidewalls and opposing end walls of the fins. Gate insulator layers may be formed by thermal oxidation, typically at 750–800 Å° C., or alternatively, may be formed by depositing a dielectric film. For the exemplary purposes of this disclosure, gate insulator layers may be SiO$_2$, a nitrided oxide material, a high-K dielectric material, or combinations thereof, as known in the art.

The next step is to form gate conductor layer overlying the gate insulator layers. Gate conductor layer may be any suitable conducting material, typically a polycrystalline silicon material, although amorphous silicon, a combination of amorphous silicon and polysilicon, polysilicon-germanium, or any other appropriate material may be used to form gate conductor layer. In addition, in some embodiments of the present invention, it might be advantageous to employ a metal gate conductor layer, such as W, Mo, or Ta, or any other refractory metal, or alternatively, a silicided gate conductor comprising polysilicon added with Ni or Co. When the gate conductor layer is a silicon material, it may be deposited as a doped layer (in-situ doping). Where the gate conductor layer is a metal layer, such layers may be deposited using physical vapor or chemical vapor deposition methods or any other technique known in the art. In this manner, gate structures are formed adjacent to oxide layers formed on opposing vertical sidewalls of the fins formed by semiconductor layer portions.

The next step is to pattern gate conductor layer and gate insulator layer. This would typically be accomplished by depositing and patterning a hardmask film. Typically, hard mask film material may be SiO$_2$ or Si$_3$N$_4$. Accordingly, gate conductor layer may be patterned and structured using well known photolithography and etching techniques to form the gate stack, i.e, using hardmask film caps as an etch mask during a directional etching of gate conductor layer. This involves selectively removing portions of gate conductor layer down to the isolation, but does not remove the portions of semiconductor layer forming the fins that are protected by hardmask film. Therefore, the fins may extend beyond the gate stack. The patterning and structuring also leaves portions of gate conductor layer, which define the gate structures adjacent the fin bodies.

The next step is to dope the exposed portion of the fins with source/drain implants. Formation of the source/drain regions may be accomplished using any of the variety of methods that have been developed to form source/drain regions and that are tailored for specific performance requirements. There are many such methods for forming source/drain regions having various levels of complexity. Thus, in some embodiments of the present invention, using ion implantation for example, lightly doped source/drain regions or other source/drain regions may be formed. Thus, for NFETs, typically P, As, or Sb for example is used for the source/drain implants in the range of 1 to 5 keV and a dose of $5 \times 10^{14}$ to $2 \times 10^{15}$ cm$^{-3}$. Similarly, for PFETs, typically B, In, or Ga for example is used for the source/drain implants in the range of 0.5 to 3 keV and dose of $5 \times 10^{14}$ to $2 \times 10^{15}$ cm$^{-3}$.

Optionally, extension and halo implants may be formed that improve Short Channel Effects (SCE). For NFETs, typically B, In, or Ga may be used for the halo implants with energies in the range of 5 to 15 keV and a dose of $1 \times 10^{13}$ to $8 \times 10^{13}$ cm$^{-3}$. Similarly, for PFETs, P, As, or Sb may be used for the halos, with energies from 20 to 45 keV and dose of $1 \times 10^{13}$ to $8 \times 10^{13}$ cm$^{-3}$.

To complete the devices contacts to sources, drains, and gates may then be formed. Accordingly, a dielectric may be deposited and planarized typically using a CMP process. Contact holes may then be structured and etched using an anisotropic process (e.g. RIE) or the like. The contact holes may be filled using any conducting material, such as doped polysilicon, silicide (e.g. WSi), metals (e.g. Au, Al, Mo, W, Ta, Ti, Cu, or ITO (indium-tin oxide)), or the like, being deposited by evaporation, sputtering, or other known techniques, thereby forming S/D contacts. Then the first metal layer may be deposited and structured using a RIE process or the like. Alternatively, the structuring of the first metal layer may be done following a damacene process flow.

Figure 7:
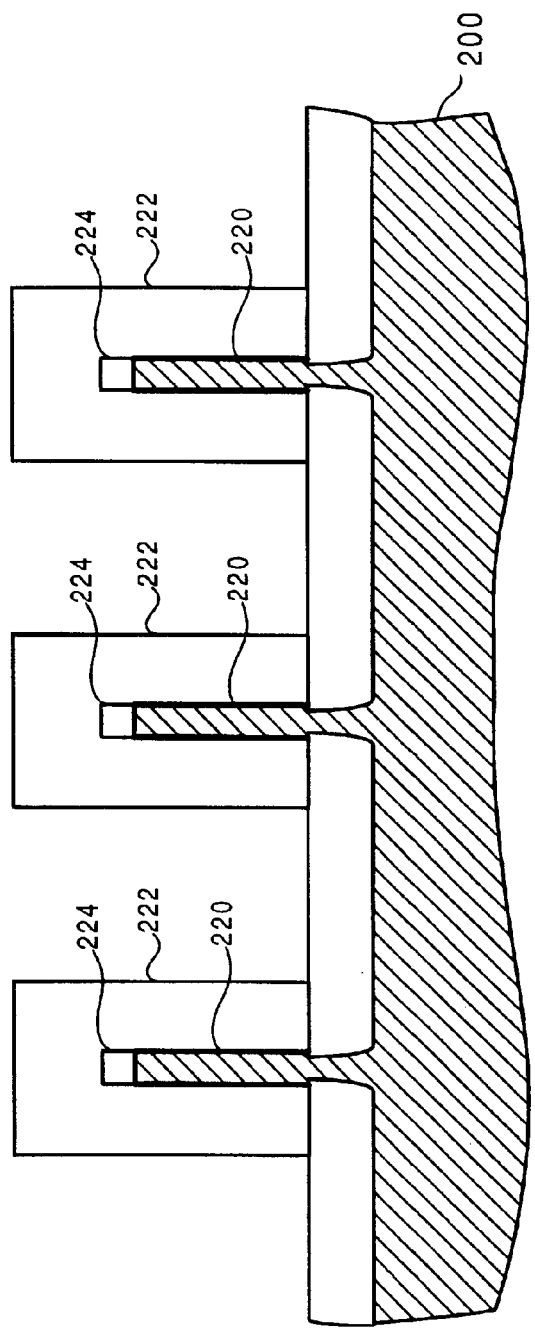

Turning now to FIG. 7, exemplary completed finFET devices are illustrated on wafer portion 200. An embodiment of the present invention is depicted having a minimum of complexity. Gate insulator layers 220 are formed on each side of the fins 210 and opposing end walls of the fins. Gates 222 are formed overlying gate insulator layers 220 and hard mask film 224. Also in this particular embodiment, gate conductor layer 222 portions is continuous across both sides of the fin, but in other embodiments, the gate conductor layer is divided into two portions.

CMOS FinFETs on the same substrate utilizing various crystal planes for FET current channels according to the present invention may be used in many different kinds of circuits, such as high performance logic, low power logic or high density memory devices, including high density multigigabit DRAMs. Moreover, the CMOS FinFETs may readily be combined with other elements, such as for example capacitors, resistors, diodes, memory cells and so forth.

The present invention thus provides a device structure and method for forming fin Field Effect Transistors (FETs) that overcomes many of the disadvantages of the prior art. Specifically, the method facilitates the formation of finFET devices from bulk semiconductor wafers with improved fin height control. Additionally, the method provides the ability to form finFETs from bulk silicon while providing isolation between fins and between the source and drain region of individual finFETs. The device structure and methods of the present invention thus provide the advantages of reliable and consistent finFET fabrication while using cost-effective bulk wafers. The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A method for forming a finFET in semiconductor substrate, the method comprising the steps of:
    forming a fin from the semiconductor substrate;
    damaging at least a portion of semiconductor substrate areas adjacent the fin; and
    growing an insulator the semiconductor substrate such that said insulator is formed in the damaged portion of the semiconductor substrate to a greater thickness than is formed on a fin sidewall.

2. The method of claim 1 wherein the step of damaging at least a portion of the semiconductor substrate adjacent the fin comprises performing an ion implantation into at least a portion of the semiconductor substrate adjacent the fin.

3. The method of claim 2 wherein the ion implantation comprises an implantation performed at an angle relative to the fin to minimize damage to the sidewall of the fins.

4. The method of claim 2 further comprising the step of providing a blocking layer on a top of the fin to reduce damage to the fin.

5. The method of claim 1 wherein the step of damaging at least a portion of the semiconductor substrate adjacent the fin comprises performing an anodic reaction to increase the porosity of at least a portion of the semiconductor substrate adjacent the fin.

6. The method of claim 5 wherein the step of performing an anodic reaction to increase the porosity of at least a portion of the semiconductor substrate adjacent the fin comprises performing a p-type implantation into the semiconductor substrate adjacent the fin, annealing the semiconductor substrate, and subjecting at least a portion of the semiconductor substrate to a chemical etchant.

7. The method of claim 1 wherein the step of forming a fin from the semiconductor substrate comprises:
    forming a height control layer in the semiconductor substrate; and
    etching the semiconductor substrate to define the fin such that the height control layer facilitates fin height uniformity.

8. The method of claim 7 wherein the step of forming a height control layer in the semiconductor substrate comprises performing an ion implant into the semiconductor substrate that damages the simiconductor substrate to change the etch rate of damaged portions of the substrate relative to undamaged portions of the semiconductor substrate.

9. The method of claim 7 wherein the step of forming a height control layer in the semiconductor substrate comprises forming a marker layer in the semiconductor substrate, and wherein the step of etching the semiconductor substrate to define the fin such that the height control layer facilitates fin height uniformity comprises monitoring for the marker layer during etching of the semiconductor substrate.

10. The method of claim 1 wherein the step of exposing the semiconductor substrate to a process that further defines the width of the fin while simultaneously isolating the fin narrows the width of the fin to less than the minimum feature size of a process used in the step of forming a fin from the semiconductor substrate.

11. A method for forming a finFET in semiconductor substrate, the method comprising the steps of:
    forming a fin from the semiconductor substrate, the fin including a fin sidewall, the formation of the fin exposing areas of the semiconductor substrate adjacent the fin;
    damaging at least a portion of the semiconductor substrate areas adjacent the fin; and
    oxidizing the semiconductor substrate such that oxide is formed in the damaged portion of the semiconductor substrate to a greater thickness than is formed on the fin sidewall.

12. The method of claim 11 wherein the step of damaging at least a portion of the semiconductor substrate adjacent the fin comprises performing an ion implant into the at least a portion of the semiconductor substrate adjacent the fin.

13. The method of claim 11 wherein the step of damaging at least a portion of the semiconductor substrate adjacent the fin comprises performing an anodic reaction to increase the porosity of at least a portion of the semiconductor substrate adjacent the fin.

14. The method of claim 13 wherein the step of performing an anodic reaction to increase the porosity of at least a portion of the semiconductor substrate adjacent the fin comprises performing a p-type implantation into the semiconductor substrate adjacent the fin, annealing the semiconductor substrate, and subjecting at least a portion of the semiconductor substrate to a chemical etchant.

15. The method of claim 11 wherein the step of forming a fin from the semiconductor substrate comprises:
    forming a height control layer in the semiconductor substrate; and
    etching the semiconductor substrate to define the fin such that the height control layer facilitates fin height uniformity.

16. The method of claim 15 wherein the step of forming a height control layer in the semiconductor substrate comprises performing an ion implant into the semiconductor substrate that damages the semiconductor substrate to change the etch rate of damaged portions of the substrate relative to undamaged portions of the substrate.

17. The method of claim 15 wherein the step of forming a height control layer in the semiconductor substrate comprises forming a marker layer in the semiconductor substrate, and wherein the step of etching the semiconductor substrate to define the fin such that the height control layer facilitates fin height uniformity comprises monitoring for the marker layer during etching of the semiconductor substrate.

18. A method for forming finFET devices from a bulk semiconductor substrate, the method comprising the steps of:

forming a height control layer in the semiconductor substrate;

forming a blocking hardmask layer on the semiconductor substrate;

etching the blocking hardmask layer and semiconductor substrate to define a plurality of fins such that the height control layer facilitates fin height uniformity, wherein a portion of the blocking hardmask layer remains on each of the plurality of fins and wherein each of the plurality of fins includes a sidewall and wherein etching of the semiconductor substrate exposes areas of the semiconductor substrate adjacent the fin;

damaging at least a portion of the semiconductor substrate areas adjacent the fin;

oxidizing the semiconductor substrate such that oxide is formed In the damaged portion of the semiconductor substrate to a greater thickness than is formed on the fin sidewall; and removing oxide from the fin sidewall while leaving at least a portion of the oxide adjacent to the fin.

* * * * *

UNITED STATES PATENT AND TRADEMARK OFFICE
CERTIFICATE OF CORRECTION

PATENT NO. : 6,642,090 B1
DATED : November 4, 2003
INVENTOR(S) : Fried et al.

It is certified that error appears in the above-identified patent and that said Letters Patent is hereby corrected as shown below:

Column 1,
Line 19, delete the word "the".
Lines 61 and 62, delete "â∈" and insert -- -- (a dash) --.

Signed and Sealed this

Thirtieth Day of December, 2003

JAMES E. ROGAN
*Director of the United States Patent and Trademark Office*